United States Patent
Liu et al.

(12) 
(10) Patent No.: US 6,242,338 B1
(45) Date of Patent: Jun. 5, 2001

(54) METHOD OF PASSIVATING A METAL LINE PRIOR TO DEPOSITION OF A FLUORINATED SILICA GLASS LAYER

(75) Inventors: Chung-Shi Liu, Hsin-Chu; Shau-Lin Shue, Hsinchu; Yao-yi Cheng, Taipei; Chen-Hua Yu; Mei-Yun Wang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/422,175

(22) Filed: Oct. 22, 1999

(51) Int. Cl.$^7$ .............................................. H01L 21/4763
(52) U.S. Cl. ...................... 438/622; 438/688; 438/637; 438/658; 438/654
(58) Field of Search .................... 438/622, 688, 438/624–629, 636–640, 653–54, 658

(56) References Cited

U.S. PATENT DOCUMENTS 5,656,543 * 8/1997 Chung .................................. 438/625
5,877,557 * 3/1999 Zawaideh ............................. 438/688

* cited by examiner

Primary Examiner—Charles Bowers
Assistant Examiner—Thanh Nguyen
(74) Attorney, Agent, or Firm—George O. Saile; Stephen B. Ackerman

(57) ABSTRACT

A process of forming a thin, protective insulator layer, on the sides of metal interconnect structures, prior to the deposition of a halogen containing, low k dielectric layer, has been developed. The process features the growth of a thin metal nitride, or thin metal oxide layer, on the exposed sides of the metal interconnect structures, via a plasma treatment, performed in either a nitrogen containing, or in a water containing, ambient. The thin layer protects the metal interconnect structure from the corrosive, as well as delamination effects, created by the halogen, or halogen products, contained in overlying low k dielectric layers, such as fluorinated silica glass.

16 Claims, 1 Drawing Sheet

METHOD OF PASSIVATING A METAL LINE PRIOR TO DEPOSITION OF A FLUORINATED SILICA GLASS LAYER

BACKGROUND OF THE INVENTION

(1) Field of the Invention

The present invention relates to methods used to fabricate semiconductor devices, and more specifically to a method used to protect a metal interconnect structure, from the reactants contained in an overlying, low k dielectric layer.

(2) Background of the Invention

The use of low k dielectric layers, as passivating, or isolating layers, have allowed increases in device performance to be realized, as a result of decreases in the capacitance component of the RC value. Low k dielectric layers, such as hydrogen silsesquioxane, (HSQ), with a dielectric constant between about 2.8 to 3.0, as well as fluorinated silica glass, (FSG), with a dielectric constant between about 3.4 to 4.0, are among a group of materials used for intermetal dielectric, (IMD), layers, resulting in decreased capacitance when compared to dielectric layers comprised with higher dielectric constants. The ability to conformally coat metal interconnect structures, and to easily fill the spaces between these metal interconnect structures, make the use of plasma enhanced chemical vapor deposited, FSG layers, attractive as a IMD layer. However the high mobility of fluorine ions, present in the FSG layer, and the affinity of the fluorine ion to moisture, can result in the formation of hydrofluoric, (HF), acid, at the FSG-metal interconnect interface. The presence of HF can in turn result in corrosion of, or damage to, the exposed, underlying metal interconnect structure, which can be comprised of aluminum —copper, tungsten, titanium, or titanium nitride. In addition to the corrosion, or damage phenomena, bubbling at the FSG-metal interconnect interface, can also occur, resulting in peeling, or delamination of the an insulator layer, such as FSG, from an underlying metal interconnect structure.

This invention will teach a process in which the surface of the metal interconnect structure is passivated, prior to deposition of the FSG layer. At the conclusion of the metal etch, post clean cycle, a plasma treatment, using $N_2O$, $N_2/H_2$, $NH_3$, or $H_2O$, is performed resulting in the formation of a thin metal oxide, or metal nitride layer, protecting the underlying metal interconnect structure from the HF effects, caused by the halogens contained in a subsequent, overlying low k dielectric layer, such as FSG. Prior art, such as Guo et al, in U.S. Pat. No. 5,763,010, describe a degassing step, performed after deposition of the FSG layer, however that prior art does not teach the plasma treatment, of a metal surface, prior to FSG deposition.

SUMMARY OF THE INVENTION

It is an object of this invention to use a low k dielectric layer, as a interlevel dielectric layer, overlyig metal interconnect structures.

It is another object of this invention to perform a plasma treatment, in a nitrogen containing, or in a moisture, or water containing, ambient, to the exposed surfaces of the metal interconnect structure, prior to deposition, or application, of a low k dielectric layer.

It is still another object of this invention to perform a plasma treatment, in a nitrogen containing, or water containing, ambient, in situ, at the conclusion of the post metal clean procedure, to form a protective layer, on the exposed surfaces of the metal interconnect structures, prior to the deposition of, or the application of, a low k dielectric layer.

In accordance with the present invention a method of protecting metal interconnect structures, from halogen build-up, at the interface of a halogen containing, low k dielectric layer metal interconnect structure, is described. After patterning of a metal, or composite metal layer, the defining photoresist layer is removed via plasma oxygen ashing procedures. This is followed by an in situ, plasma treatment, performed in a nitrogen containing, or a water containing ambient, resulting in the formation of a thin metal nitride, or metal oxide layer, on the exposed surfaces of the metal interconnect structures. The plasma treatment can also be performed in a separate tool. A low k dielectric layer, such as a halogen containing, FSG layer, is then deposited, or applied, with the thin metal nitride, or metal oxide layer, protecting the underlying metal interconnect structures, from halogen ions, located in the low k dielectric layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
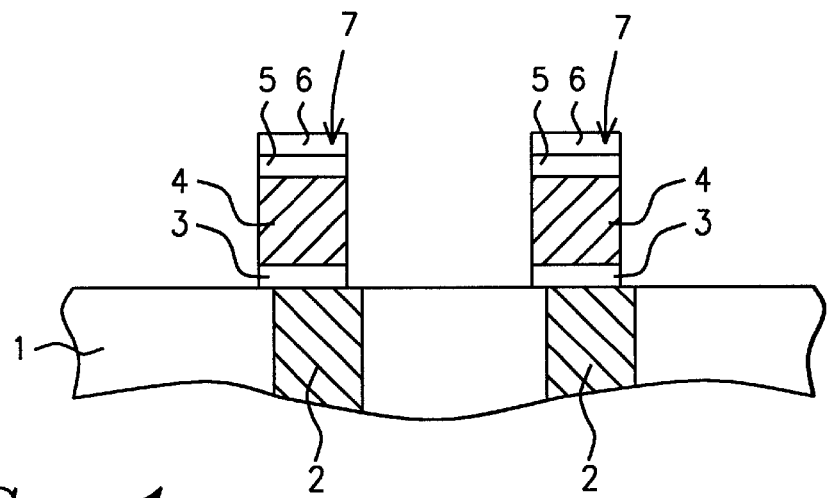
FIGS. 1–3, which schematically, in cross-sectional style, describe the key stages of fabrication used to form a thin protective layer, on the surfaces of underlying metal interconnect structures, prior to the deposition of a halogen containing, low k dielectric layer.

The method of forming a protective metal nitride, or metal oxide layer, on the surfaces of metal interconnect structures, exposed during the deposition of a halogen containing, low k dielectric layer, will now be described in detail. FIG. 1, schematically shows a conductive region 2, embedded in insulator layer I. Conductive region 2, can be a metal plug structure, or an underlying metal interconnect structure, with each comprised from a group of conductive materials including, aluminum, aluminum - copper, tungsten, or a metal silicide layer, such as tungsten silicide. Conductive region 2, can also be an active device region, in a semiconductor substrate, such as a source/drain region. Insulator layer 1, can be either a silicon oxide layer, a borophosphosilicate layer, or a composite insulator layer, such as silicon nitride-silicon oxide. Metal interconnect structures 7, are shown schematically in FIG. 1, overlying, and contacting a portion of the top surface of conductive regions 2. Metal interconnect structures 7, can be comprised of aluminum-copper. For the aluminum-copper example, a composite adhesive barrier layer 3, comprised of an underlying titanium adhesive layer, and an overlying titanium barrier layer, are deposited via plasma vapor deposition, (PVD), or via R.F. sputtering procedures, to a thickness between about 200 to 700 Angstroms. The deposition of aluminum copper layer 4, is next performed, again via PVD or R.F. sputtering procedures, to a thickness between about 3000 to 10000 Angstroms, with a weight percent of copper between about 0 to 4%. An overlying titanium nitride barrier layer 5, is next deposited, via PVD or R.F. sputtering, to a thickness between about 200 to 700 Angstroms. If desired, silicon oxynitride layer 6, used as an anti-reflective coating, (ARC), layer, can be employed to optimize the photolithographic exposure, performed to define the photoresist image that is used as a mask for definition of metal interconnect structures 7. If this option is employed, silicon oxynitride layer 6, can be deposited via chemical vapor deposition procedures, to a thickness between about 200 to 600 Angstroms. Another option is the use of tungsten as the material for the metal interconnect structures.

A photoresist shape, not shown in the drawings, is used as a mask to allow an isotropic, reactive ion etching, (RIE), procedure, to define metal interconnect structures 7, shown schematically in FIG. 1. The RIE procedure is performed using $CHF_3$ as an etchant for silicon oxynitride layer 6, while $Cl_2$ or $SF_6$, is used as an etchant for titanium nitride layer 5, for aluminum-copper layer 4, and for composite, titanium nitride-titanium layer 3. The photoresist shape, used to define metal interconnect structures 7, is removed via a plasma oxygen ashing procedure. At this point the sides of metal interconnect structures 7, specifically the aluminum-copper portion, are exposed, and a subsequent low k dielectric layer, such as fluorinated silica glass, (FSG), can deleteriously effect the exposed aluminum-copper surfaces. The high mobility of fluorine ions, incorporated in an FSG layer, and the affinity of these fluorine ions to move to the surface of the aluminum-copper structure, can result in a high concentration of fluorine at the FSG-aluminum interface. With the presence of moisture, a hydrofluoric, (HF), solution can be formed, attacking, or corroding the exposed surfaces of aluminum-copper layer 4, and the exposed surfaces of composite titanium nitride-titanium layer 3. This will result in unwanted resistance increases, for metal interconnect structures 7, and possibly peeling, or delamination of a subsequent insulator layer, such as FSG, from underlying metal interconnect structure 7.

Figure 2:
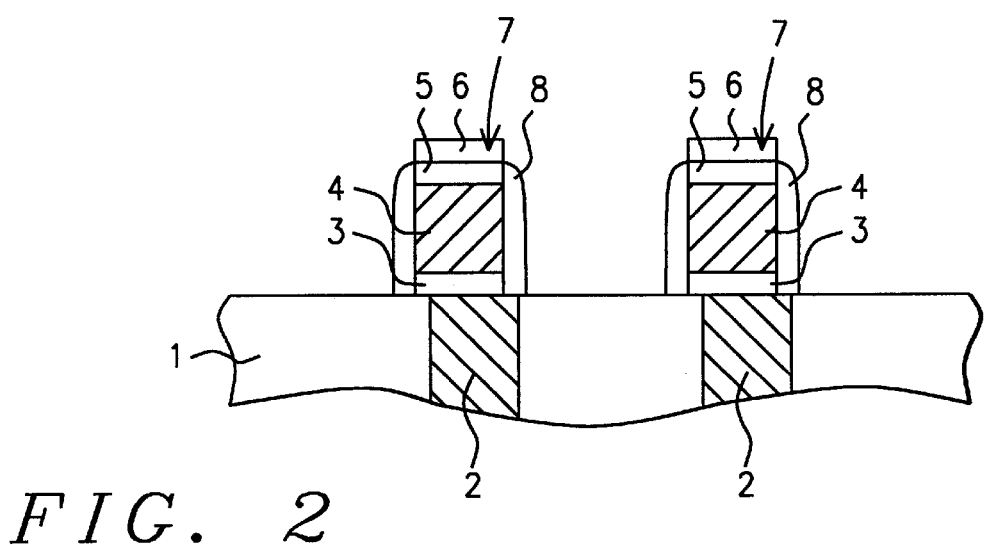

A method of protecting the exposed regions of metal interconnect structures 7, from fluorine ions, or from HF attack, after deposition of the fluorine containing, FSG layer, will now be described. A plasma treatment, either performed in situ, in the same tool used for photoresist ashing, but in a different chamber of the tool, or performed in a tool other then the tool used for ashing, is next addressed. The plasma treatment is performed at a temperature between about 100 to 400° C., at a pressure between about 0.5 to 50 torr, at an R.F. power between about 100 to 500 watts, in a nitrogen containing ambient, such as $N_2O$, $NH_3$, or $N_2/H_2$, or in a water containing ambient. The plasma treatment results in the formation of thin insulator layer 8, on the exposed surfaces of metal interconnect structures 7. If a nitrogen containing ambient were used, thin insulator layer 8, would be comprised of aluminum nitride, at a thickness between about 20 to 200 Angstroms, in regions interfacing aluminum-copper layer 4. If a water containing ambient were used thin insulator layer 8, would be an aluminum oxide layer, at a thickness between about 20 to 200 Angstroms, in the regions interfacing aluminum-copper layer 4, while thin insulator layer 8, would be a titanium oxide layer, in regions in which thin insulator layer 8, interfaced composite titanium nitride-titanium layer 3, and titanium nitride layer 5. The thin insulator layer, formed using the water containing ambient, is the case schematically shown in FIG. 2. If metal interconnect structures are comprised of tungsten, thin insulator layer 8, now a tungsten nitride, or a tungsten oxide layer, would still be formed using the identical plasma treatments, previously described to form thin insulator layer on the aluminum-copper, metal interconnect structures.

Figure 3:
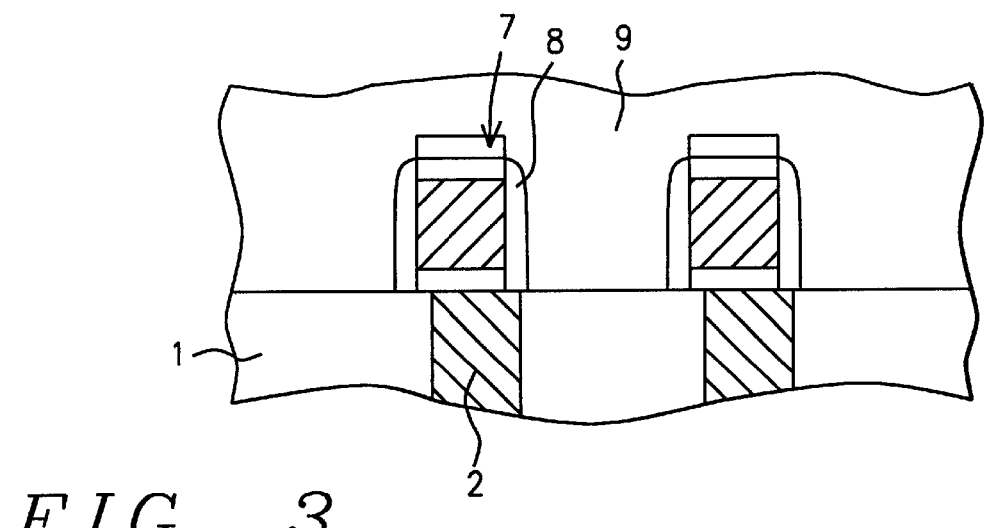

A low k dielectric layer 9, such as FSG is next deposited via plasma enhanced chemical vapor deposition procedures, to a thickness between about 8000 to 20000 Angstroms. The low dielectric layer, deposited at a temperature between about 350 to 450° C., conformally covers metal interconnect structures 7, and fills the spaces between metal interconnect structures 7. This is schematically shown in FIG. 3. The fluorine ions, in FSG layer 9, and the formation of HF at the FSG-metal interconnect structure interface, however can not attack any portion of metal interconnect structures 7, due to the presence of thin aluminum nitride, or thin aluminum oxide layer 8. Other low k dielectric layers such as hydrogen silsesquioxane, (HSQ), or other halogen containing low k dielectric layers, such as a fluorinated polymer layer, can also be used to passivate metal interconnect structures 7.

While this invention has been particularly shown and described with reference to the preferred embodiments thereof, it will be understood by those skilled in the art that various changes in form and details may be made without departing from the spirit or scope of the invention.

What is claimed is:

1. A method of forming a low k dielectric layer, on metal interconnect structures, comprising the steps of
   providing conductive regions, in, or on, a semiconductor substrate, with the conductive regions embedded in an underlying insulator layer;
   forming said metal interconnect structures, with first portions of said metal interconnect structures located on portions of the top surface of said underlying insulator layer, and with second portions of said metal interconnect structures, overlying, and contacting, portions of the top surface of said conductive regions;
   performing a plasma treatment to form a thin aluminum oxide layer, on the exposed surfaces of said metal interconnect structures; and
   forming said low k dielectric layer, on said metal interconnect structures, and on regions of said underlying insulator layer, not covered by said metal interconnect structures.

2. The method of claim 1, wherein said conductive regions are lower level, metal interconnect structures, or metal plug structures, comprised of a metal chosen from a group that includes, aluminum, aluminum-copper, tungsten, or tungsten silicide.

3. The method of claim 1, wherein said conductive regions are active device regions, such a source/drain regions, located in said semiconductor substrate.

4. The method of claim 1, wherein said underlying insulator layer is either a silicon oxide layer, a borophosphosilicate layer, or a composite insulator layer comprised of silicon nitride on silicon oxide.

5. The method of claim 1, wherein said metal interconnect structures are comprised of an underlying composite layer of a titanium nitride barrier layer on a titanium adhesive layer, obtained via plasma vapor deposition, or via R.F. sputtering, to a thickness for the composite layer between about 200 to 700 Angstroms; an aluminum-copper layer, obtained via plasma vapor deposition or R.F. sputtering, to a thickness between about 3000 to 10000 Angstroms, comprised with between about 0 to 4 weight % copper; and an overlying titanium nitride layer, obtained via plasma vapor deposition, or R.F. sputtering procedures, to a thickness between about 200 to 700 Angstroms.

6. The method of claim 1, wherein said metal interconnect structures are defined via an an anisotropic RIE procedure, using $Cl_2$ or $SF_6$, as an etchant for a titanium nitride layer, for an aluminum-copper layer, and for a composite layer of titanium nitride on titanium.

7. The method of claim 1, wherein said thin aluminum oxide layer is formed on the sides of said metal interconnect structures, via said plasma treatment, performed in an water ambient, at a temperature between about 100 to 400° C., at a pressure between about 0.5 to 50 torr, and using an R.F. power between about 100 to 500 watts.

8. The method of claim 1, wherein said low k dielectric layer is a fluorinated silica glass layer, obtained via plasma enhanced chemical vapor deposition procedures, at a temperature between about 350 to 450° C., to a thickness between about 8000 to 20000 Angstroms.

9. A method of forming a thin aluminum oxide layer on the sides of metal interconnect structures, to protect the metal interconnect structure from halogen ions, present in an overlying low k dielectric layer, comprising the steps of:

providing conductive regions, in, or on, a semiconductor substrate, with the conductive regions embedded in a intermetal dielectric, (IMD), or interlevel dielectric, (ILD), layer;

forming aluminum based, metal interconnect structures, with first portions of said aluminum based, metal interconnect structures, located on portions of the top surface of said IMD layer, and with second portions of said aluminum based, metal interconnect structures, overlying, and contacting, portions of said conductive regions;

performing an in situ, plasma treatment, in a tool used to remove a photoresist shape previously used as a mask to define said aluminum based, metal interconnect structures, with said plasma treatment performed in a water containing ambient, forming said thin aluminum oxide layer on the sides of said aluminum based, metal interconnect structures; and depositing a halogen containing, low k dielectric layer, covering said aluminium based, metal interconnect structures, and filling the spaces between said aluminum based, metal interconnect structures.

10. The method of claim 9, wherein said conductive regions are lower level metal interconnect structures, or metal plug structures, comprised of a metal chosen from a group that includes; aluminum, aluminum-copper, tungsten, or tungsten silicide.

11. The method of claim 9, wherein said conductive regions are active device regions, in said semiconductor substrate, such as source/drain regions.

12. The method of claim 9, wherein said IMD, or said ILD layer, is comprised of an insulator, or composite insulator layer, chosen from a group that contains; silicon oxide, borophosphosilicate glass, or a composite layer comprised of silicon nitride on silicon oxide.

13. The method of claim 9, wherein said aluminum based, metal interconnect structures are comprised of: an underlying, composite layer comprised of a titanium nitride barrier layer, and an underlying titanium adhesive layer, obtained via plasma vapor deposition, or R.F. sputtering procedures, at a thickness between about 200 to 700 Angstroms, an aluminum-copper layer, obtained via plasma vapor deposition, or R.F. sputtering procedures, at a thickness between about 3000 to 10000 Angstroms, with a weight percent of copper between about 0 to 4; and an overlying titanium nitride layer, obtained via plasma vapor deposition procedures, at a thickness between about 200 to 700 Angstroms.

14. The method of claim 9, wherein said aluminum based, metal interconnect structures are formed via an anisotropic RIE procedure, using $Cl_2$ or $SF_6$ as an etchant for titanium nitride, for aluminum-copper, and for the titanium nitride-titanium composite.

15. The method of claim 9, wherein said thin aluminum oxide layer, on the sides of said aluminum based, metal interconnect structures, is formed at a thickness between about 20 to 200 Angstroms, during said in situ plasma treatment, in an ambient containing water, at a temperature between about 100 to 400° C.

16. The method of claim 9, wherein said halogen containing, low k dielectric layer, is a FSG layer, at a thickness between about 8000 to 20000 Angstroms, obtained via plasma enhanced chemical vapor deposition procedures, at a temperature between about 350 to 450° C.

* * * * *